United States Patent [19]
Hashemi et al.

[11] Patent Number: 5,478,437
[45] Date of Patent: Dec. 26, 1995

[54] SELECTIVE PROCESSING USING A HYDROCARBON AND HYDROGEN

[75] Inventors: Majid M. Hashemi; Jonathan K. Abrokwah, both of Tempe; Stephen P. Rogers, Phoenix, all of Ariz.

[73] Assignee: Motorola, Inc., Schaumburg, Ill.

[21] Appl. No.: 283,331

[22] Filed: Aug. 1, 1994

[51] Int. Cl.$^6$ .......................... H01L 21/00; H01L 21/465
[52] U.S. Cl. .................. 156/646.1; 437/228; 204/192.35
[58] Field of Search ........................................ 156/643, 644, 156/646, 662, 665; 437/228; 204/192.35

[56] References Cited

U.S. PATENT DOCUMENTS

| | | | |
|---|---|---|---|
| 5,068,007 | 11/1991 | Rogers et al. | |
| 5,074,955 | 12/1991 | Henry et al. | 156/646 |
| 5,171,401 | 12/1992 | Roselle | 156/643 |
| 5,185,293 | 2/1993 | Franke et al. | 156/643 |
| 5,298,466 | 3/1994 | Brasseur | 156/643 |

OTHER PUBLICATIONS

"Etch rates and surface chemistry of GaAs and AlGaAs reactively ion etched in $C_2H_6/H_2$" Pearton et al. J. Appl. Phys. 66(10), 15 Nov. 1989. pp. 5009–5017.

"Alkane based plasma etching of GaAs" Law et al. J. Vac. Sci. Technol. B, vol. 9, No. 3, May/Jun. 1991 pp. 1449–1455.

L. Henry et al., "GaInAS Junction FET Fully Dry Etched by Metal Organic Reactive Ion Etching Technique", Electron Lett., 23, pp. 1254–1255.

V. Law et al., "Selective metalorganic reactive ion etching of molecular–beam epitaxy GaAs/Al$_x$Ga$_{1-x}$As", V. Vac. Sci. Technol. B7(6), Nov./Dec. 1989, pp. 1479–1482.

Vatus et al., "Highly Selective Reactive Ion Etching Applied to the Fabrication of Low–Noise AlGaAs GaAs FET's", IEEE Transactions on Electron Devices, vol. ED–33, No. 7, Jul. 1986, pp. 934–937.

R. Pereira et al. "$CH_4/H_2$ reactive ion etching for gate recessing of pseudamorphic modulation doped field effect transistors", J. Vac. Sci. Technol. B9(4), Jul./Aug. 1991 pp. 1978–1980.

G. McLane et al., "Magnetron–enhanced reactive ion etching of GaAs and AlGaAs using $CH_4/H_2/Ar$", J. Vac. Sci. Technol. A (11(4), Jul./Aug. 1993, pp. 1753–1757.

N. Cameron et al., "An investigation of CH4/H2 reactive ion etching damage to thin heavily doped GaAs metal–semiconductor field effect transistor layers during gate recessing", J. Vac. Sci. Technol. B 8(6), Nov./Dec. 1990, pp. 1966–1969.

Primary Examiner—Nam Nguyen
Assistant Examiner—Rodney G. McDonald
Attorney, Agent, or Firm—Miriam Jackson

[57] ABSTRACT

A layer is plasma etched or deposited with a gaseous mixture of a hydrocarbon, hydrogen and a noble gas. A cathode DC bias of greater than 600 V is used. This cathode DC bias allows for selectively etching a III–V material over an aluminum containing layer or for the deposition of a hydrogenated carbon film.

22 Claims, 2 Drawing Sheets

SELECTIVE PROCESSING USING A HYDROCARBON AND HYDROGEN

BACKGROUND OF THE INVENTION

This invention relates, in general to a hydrocarbon/hydrogen based selective process, and more particularly, to selective etching of III–V semiconductor materials or the selective deposition of hydrogenated carbon materials.

One of the key steps in manufacturing gallium arsenide field effect transistors is the removal of a gallium arsenide (GaAs) n$^+$ contact layer overlying an aluminum gallium arsenide layer. (AlGaAs) without etching of the AlGaAs layer. In the past, a complicated, pH controlled, wet chemical etch or dry etching has been utilized. Wet chemical etching results in nonuniformities across a substrate, therefore, some over-etching was required to ensure the complete removal of the gallium arsenide layer across the entire substrate.

A disadvantage of this wet process was that the pH of this wet chemical etchant had to be monitored extremely carefully during the entire etch process in order to maintain high selectivity between the GaAs layer and the AlGaAs layer. Another disadvantage was that the over-etch process undercut the gallium arsenide layer and thus degraded device performance and caused nonuniformity of device characteristics across the substrate.

Selective dry etching has been demonstrated using chlorine/fluorine based chemistries. However, all of these processes involve gases that are corrosive, toxic and environmentally hazardous.

In order to fabricate devices having superior and uniform electrical characteristics, it is desirable to minimize the undercut length of the GaAs layer and to minimize nonuniformities in the etch of the GaAs layer.

DETAILED DESCRIPTION OF THE DRAWINGS

Figure 1:
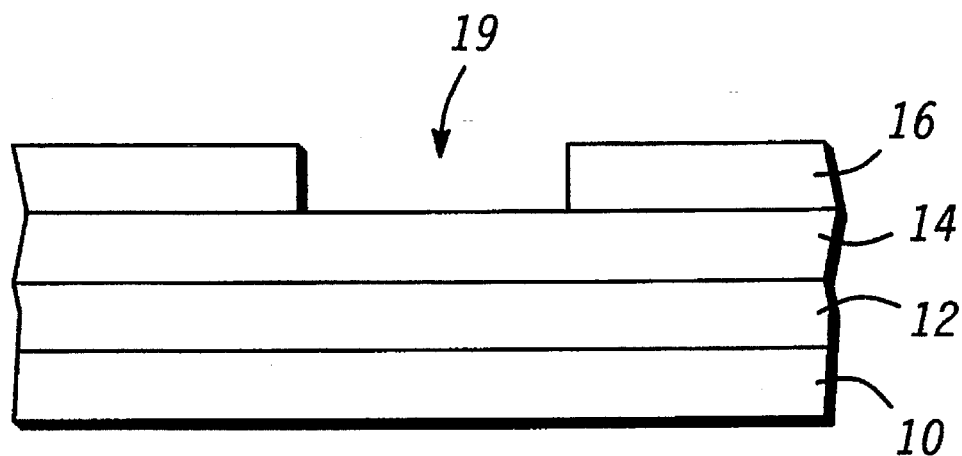
FIG. 1 illustrates a cross-sectional view of a structure used in the etching process according to one embodiment of the present invention.

FIG. 1 illustrates a cross-sectional view of a structure which can be processed using a dry etch or plasma process in accordance with the present invention. A III–V semiconductor material 10 is provided having a layer 12 comprised of aluminum formed thereover. A III–V semiconductor layer 14 is formed over layer 12. A mask 16 is formed and patterned over III-V semiconductor material 14 to provide an opening 19 over a portion of III–V semiconductor material 14. The objective of this invention is to remove the portion of III–V semiconductor material 14 which is not masked by masking layer 16 while removing only a negligible amount of layer 12 or removing as little as possible of layer 12.

In one embodiment, III–V semiconductor material 14 is comprised of GaAs, however, other III–V materials such as indium phosphide (InP), indium gallium arsenide (InGaAs), or gallium antimonide (GaSb) may be used. If III–V semiconductor material 14 is comprised of GaAs, layer 12 comprised of aluminum is comprised of $Al_xGa_{1-x}As$ where $0<x<1$. If III–V semiconductor material 14 is comprised of InP, layer 12 is comprised of $Al_xIn_{1-x}As$ where $0<x<1$. III–V semiconductor material 10 may be comprised of, for example, GaAs or InP. Masking layer 16 is preferably comprised of silicon nitride, however, other materials such as silicon dioxide, nickel, gold or aluminum can be used.

Figure 2:
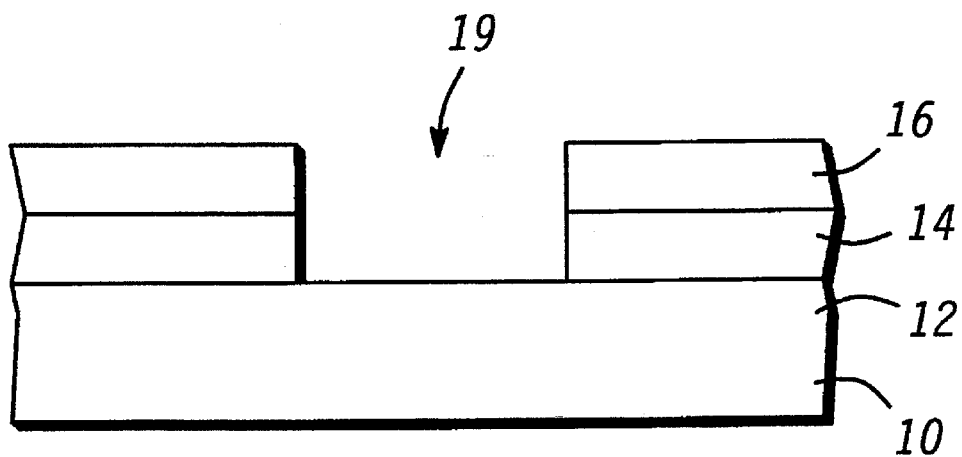
FIG. 2 illustrates a cross-sectional view of a structure processed using the etching process in accordance with one embodiment of the present invention.

FIG. 2 illustrates the structure of FIG. 1 further along in processing. III–V semiconductor layer 14 is etched using a hydrocarbon, hydrogen, and a noble gas mixture. For reactive ion etching (RIE), plasma reactor configurations vary widely, and a figure of merit which allows for RIE plasma processes to be compared is induced self DC bias or cathode DC bias. In order to obtain increasing selectivity of etching III–V semiconductor material 14 over etching layer 12, it is important that a cathode DC bias of greater than 600 volts (V) be used. Most preferably, a cathode DC bias of greater than or equal to 650 V in order to achieve an etch rate of less than or equal to 10 angstroms per minute of layer 12. It is desirable to achieve high selectivities of layer 14 over layer 12 greater than 100 to 1.

The hydrocarbon is preferably methane, however, other hydrocarbons may be used. The noble gas is preferably comprised of argon, however, other noble gases such as helium, krypton, or neon may be used. Inert gases which are not noble gases, such as nitrogen, should not be used. Ar is preferred for its economical availability and purity. In this invention, argon aids in stabilizing the plasma, increases the average electron energy distribution within the plasma, increases the number density of atomic hydrogen species, and provides ion-enhanced chemical kinetics at the surface of layer 14. Preferably the gaseous mixture is comprised of by volume, between 5 and 30% of a hydrocarbon, less than 40% hydrogen, and less than 60% of a noble gas.

Figure 3:
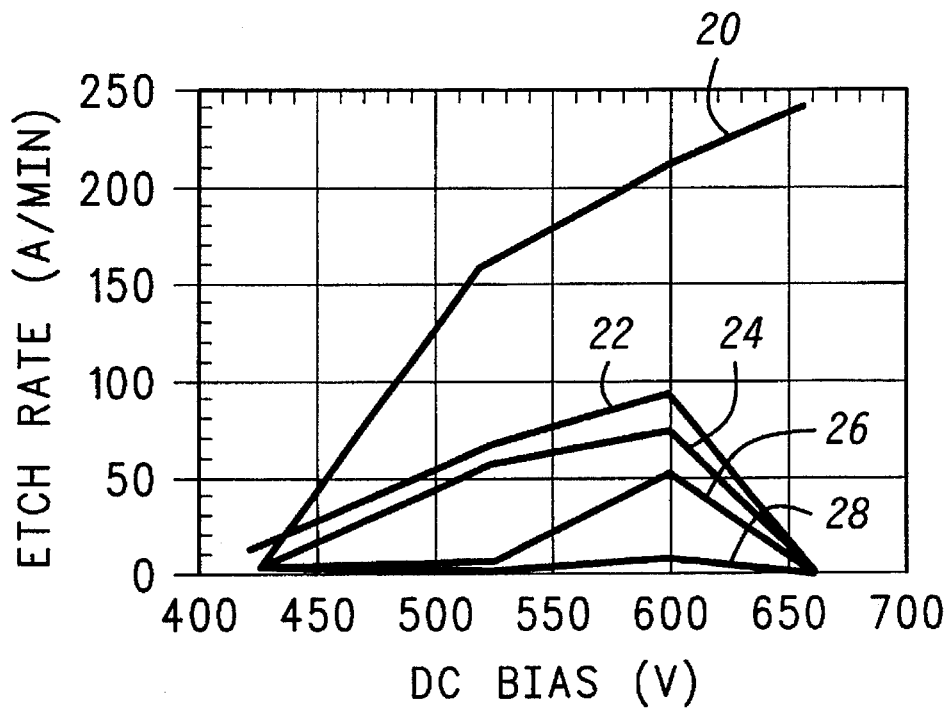
FIG. 3 illustrates a graph of experimental data of etch rate using the etching process according to one embodiment of the present invention.

FIG. 3 illustrates a graph of cathode DC bias versus etch rate for an AlGaAs layer comprised of varying mole fractions of aluminum. FIG. 3 clearly illustrates the unexpected results obtained by using the present invention. Values of cathode DC biases below or equal to 600 V have been typically published. One would have expected the trend of higher etch rates to continue even above 600 V. Therefore, it was not anticipated to see etch rates decreasing above a cathode DC bias of 600 V. The discovery that the etch rates decreased at a certain cathode DC bias level was critical to obtaining the selective etch process of the present invention.

It is believed that the etch rate decreases for AlGaAs (layer 12) at cathode DC biases greater than 600 V because the energetics within the plasma at the higher plasma powers shift the kinetics of the overall plasma process to deposition in nature by one or a combination of factors. Higher plasma powers yield, in part, to the creation of a larger number density of polymer forming precursors such as methyl ($CH_3$) and methylene ($CH_2$), radicals, and/or the increased number density of gaseous ions, particularly argon ions in the etch process of the present invention. With DC bias above 600 V, the increased argon ion number density lead to an increase flux of ions to layer 14 and reducing the probability of a volatile organo aluminum etch product. Sputtering in this case may not be observed because the ion energy is dissipated in bond breakage and/or gaseous hydrocarbon formation.

It is believed that reduced etch rates of AlGaAs and increased deposition of hydrocarbon polymers below a DC bias of 425 V (lower plasma powers) results from a reduced number density of noble gas ions, reduced number density of atomic hydrogen species, and lower average electron energy distribution in the plasma. An indication of reduced number densities of ions is the decrease in DC bias for the same gas chemistry and pressure. Also related to the DC bias is the kinetic energy of ions that transverse a plasma sheath through the potential difference between the average plasma potential and the average self bias. The ion energy or flux required to remove etch inhibitors such as surface oxides or hydroxides may be insufficient for III–V semiconductor etching at these conditions. The reduced number density of atomic hydrogen in this plasma energy regime will result in an increase of gas phase polymerization, and also affect the formation of surface hydride intermediates leading to volatile products. With DC biases of 425 V, the increased gas phase polymerization reduces the number of reactive methyl species for the formation of the volatile organo aluminum etch products; thus, a depletion effect is observed.

The example illustrated in FIG. 3 was carried out using $CH_4:H_2:Ar$ (18:24:40) at a pressure of 30 millitorr and a temperature of 25° C. Line 20 represent the etch rate of GaAs layer 14. Line 22 represents the etch rate of an AlGaAs layer having 30% aluminum, line 24 represents the etch rate of an AlGaAs layer having 50% aluminum, line 26 represents an AlGaAs layer having an aluminum content of 75%, and line 28 represents an aluminum arsenide layer. Lines 22, 24, 26, and 28 represent possible compositions of layer 12.

The graph of FIG. 3 shows that as cathode DC bias increases, the etch rate of gallium arsenide, illustrated by line 20, steadily increases. In contrast, the etch rate of aluminum gallium arsenide, lines 22, 24, and 26 increases with increasing cathode DC bias up to a cathode DC bias of 600 V and then the etch rate begins to decline.

In the past, it was believed to be undesirable to use a high cathode DC bias etch due to damage of the underlying layer. Experimental results related to the present invention have shown no such adverse effects using a hydrocarbon/hydrogen based chemistry. It is important that a layer 12 comprised of aluminum underlie III–V semiconductor layer 14 so that layer 12 can act as an etch stop layer. Developing an etch stop process is extremely important in fabricating electrical and optoelectronic devices.

Figure 4:
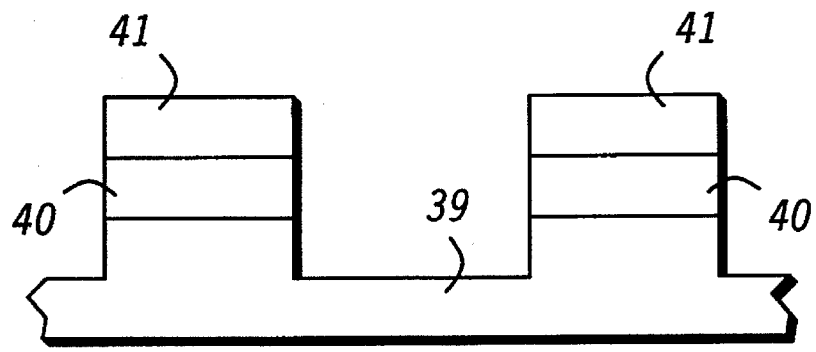
FIG. 4 illustrates a cross-sectional view of a structure formed using the selective deposition process according to one embodiment of the present invention.

FIG. 4 illustrates a nonplanar structure formed utilizing a selective deposition process in accordance with the present invention. In this embodiment, a layer 39 is provided which does not contain aluminum. Most preferably, layer 39 is comprised of a III–V semiconductor material, such as GaAs, InP, InGaAs, or GaSb. A layer 40 comprised of aluminum is selectively provided over portions of layer 39 using conventional processes known in the art. Layer 40 is preferably comprised of a III–V semiconductor material comprised of aluminum, such as $Al_xGa_{1-x}As$, $Al_xIn_{1-x}As$. A hydrogenated carbon layer 41 is selectively deposited on layer 40. At the same time, a portion of layer 39 is etched where layer 40 is not disposed. In this manner, a selective deposition process can be performed.

A method of selectively etching or selectively depositing a layer has been provided. The use of hydrocarbon and hydrogen along with a noble gas at a cathode DC bias above 600 V, provides for etching of a III–V semiconductor material without etching an underlying layer comprised of aluminum. The same chemistry and cathode DC biases may be used to deposit hydrogenated carbon films selectively on layers comprised of aluminum.

We claim:

1. A method of processing, comprising the steps of:
providing a substrate comprised of a III–V semiconductor material;
selectively forming a layer comprised of aluminum over a portion of the substrate; and
subjecting the substrate and the layer comprised of aluminum to a gaseous-mixture comprised of a hydrocarbon, hydrogen and a noble gas, using a cathode DC bias greater than 600 V so as to form a hydrogenated carbon layer comprised of aluminum and to etch the substrate where the layer comprised of aluminum is not disposed.

2. The method of claim 1 wherein the step of providing the layer comprised of aluminum comprises providing the layer comprised of aluminum selected from a group consisting of aluminum gallium arsenide and aluminum indium arsenide.

3. The method of claim 1 wherein the step of subjecting the substrate to the gaseous mixture comprises subjecting the substrate to the gaseous mixture comprised of, by volume, between 5 and 30% of a hydrocarbon, less than 40% of hydrogen, and less than 60% of a noble gas.

4. The method of claim 1 wherein the step of subjecting the substrate to a gaseous mixture comprises using a cathode DC bias greater than or equal to 650 V.

5. The method of claim 1 wherein the step of subjecting the substrate to the gaseous mixture comprises subjecting the substrate to the gaseous mixture comprised of methane, hydrogen, and argon.

6. A method of dry etching a III–V semiconductor material, comprising the steps of:
providing a layer comprised of aluminum;
providing a III–V semiconductor material over the layer comprised of aluminum; and
etching a portion of the III–V semiconductor material with a gaseous mixture comprised of a hydrocarbon, hydrogen, and a noble gas, using a cathode DC bias greater than 600 V whereby the portion of the III–V semiconductor material is selectively etched over the layer comprised of aluminum.

7. The method of claim 6 further comprising the step of forming a masking layer over a portion of the III–V semiconductor material before the step of etching.

8. The method of claim 7 wherein the step of forming the masking layer comprises forming a silicon nitride layer.

9. The method of claim 6 wherein the step of etching the portion of the III–V semiconductor material comprises etching with a gaseous mixture comprised of methane, hydrogen, and argon.

10. The method of claim 6 wherein the step of etching the portion of the III–V semiconductor material comprises etching with the gaseous mixture comprised of, by volume, between 5 and 30% of a hydrocarbon, less than 40% of hydrogen, and less than 60% of a noble gas.

11. The method of claim 6 wherein the step of etching the portion,of the III–V semiconductor material comprises etching using a cathode DC bias greater than or equal to 650 V.

12. The method of claim 6 wherein the step of providing the layer comprised of aluminum comprises providing the layer comprised of aluminum selected from a group consisting of aluminum gallium arsenide and aluminum indium arsenide.

13. The method of claim 6 wherein the step of providing the III–V semiconductor material comprises providing the III–V semiconductor material selected from a group consisting of gallium arsenide, indium phosphide, and indium gallium arsenide.

14. The method of claim 6 further comprises the step of etching a portion of the layer comprised of aluminum at a rate of less than or equal to 10 Angstroms per minute.

15. A method of etching a III–V semiconductor material, comprising the steps of:

providing a layer comprised of aluminum;

providing a III–V semiconductor material over the layer comprised of aluminum; and etching a portion of the III–V semiconductor material with a gaseous mixture comprised of, by volume, between 5 and 30% of a hydrocarbon, less than 40% of hydrogen, and less than 60% of a noble gas, using a cathode DC bias greater than 600 V, wherein the III–V semiconductor material is selectively etched over the layer comprised of aluminum.

16. The method of claim 15 further comprising the step of forming a masking layer over a portion of the III–V semiconductor material before the step of etching.

17. The method of claim 16 wherein the step of forming the masking layer comprises forming a silicon nitride layer.

18. The method of claim 15 wherein the step of etching the portion of the III–V semiconductor material comprises etching with a gaseous mixture comprised of methane, hydrogen, and argon.

19. The method of claim 15 wherein the step of etching the portion of the III–V semiconductor material comprises etching with the gaseous mixture comprised of, by volume, between 5 and 30% of methane, less than 40% of hydrogen, and less than 60% of argon.

20. The method of claim 15 wherein the step of etching the portion of the III–V semiconductor material comprises etching using a cathode DC bias greater than or equal to 650 V.

21. The method of claim 15 wherein the step of providing the layer comprised of aluminum comprises providing the layer comprised of aluminum selected from a group consisting of aluminum gallium arsenide and aluminum indium arsenide.

22. The method of claim 15 wherein the step of providing the III–V semiconductor material comprises providing the III–V semiconductor material selected from a group consisting of gallium arsenide, indium phosphide, and indium gallium arsenide.

\* \* \* \* \*